US012563883B2

(12) United States Patent
Zhan et al.

(10) Patent No.: US 12,563,883 B2
(45) Date of Patent: Feb. 24, 2026

(54) IMAGE SENSOR AND MANUFACTURING METHOD THEREOF

(71) Applicant: UNITED MICROELECTRONICS CORP., Hsin-Chu (TW)

(72) Inventors: Zhaoyao Zhan, Singapore (SG);
Qianwei Ding, Singapore (SG);
Xiaohong Jiang, Singapore (SG);
Ching Hwa Tey, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 438 days.

(21) Appl. No.: 18/122,718

(22) Filed: Mar. 17, 2023

(65) Prior Publication Data

US 2023/0225139 A1 Jul. 13, 2023

Related U.S. Application Data

(63) Continuation-in-part of application No. 17/137,300, filed on Dec. 29, 2020, now Pat. No. 11,641,000.

(30) Foreign Application Priority Data

Nov. 23, 2020 (CN) .......................... 202011318904.0

(51) Int. Cl.
| | |
|---|---|
| *H01L 31/032* | (2006.01) |
| *H01L 27/146* | (2006.01) |
| *H10K 39/32* | (2023.01) |
| *H10K 85/50* | (2023.01) |

(52) U.S. Cl.
CPC ............. *H10K 39/32* (2023.02); *H10K 85/50* (2023.02)

(58) Field of Classification Search
CPC .... H10F 77/127; H10F 39/014; H10F 39/016; H10F 39/182; H10F 39/8053; H10F 39/8063; H10F 39/811; H10F 77/122; H10F 77/1437; H10F 39/011; H10F 39/18; H10K 39/32; H10K 85/50
See application file for complete search history.

(56) References Cited

U.S. PATENT DOCUMENTS

| | | | |
|---|---|---|---|
| 8,710,488 B2 | 4/2014 | Yu | |
| 9,263,613 B2 | 2/2016 | Yu | |

(Continued)

FOREIGN PATENT DOCUMENTS

| | | |
|---|---|---|
| CN | 101803035 A | 8/2010 |
| CN | 102741681 A | 10/2012 |

(Continued)

*Primary Examiner* — Jarrett J Stark
(74) *Attorney, Agent, or Firm* — Winston Hsu

(57) ABSTRACT

The present invention provides an image sensor, the image sensor includes a substrate, a first circuit layer on the substrate, at least one nanowire photodiode. located on the first circuit layer and electrically connected with the first circuit layer, wherein the nanowire photodiode comprises a lower material layer and an upper material layer, and a P-N junction or a Schottky junction is arranged between the lower material layer and the upper material layer, wherein the lower material layer comprises a perovskite material, and a precursor layer located under the lower material layer, wherein the precursor layer comprises different metal elements as the lower material layer.

22 Claims, 6 Drawing Sheets

(56) References Cited

U.S. PATENT DOCUMENTS

| 11,641,000 B2 * | 5/2023 | Zhan | H10F 77/122 |
| | | | 257/432 |
| 12,345,596 B2 * | 7/2025 | Sternklar | G01M 11/333 |
| 12,426,432 B2 * | 9/2025 | Alhawsawi | H10F 77/12 |
| 2008/0247226 A1 | 10/2008 | Liu | |
| 2010/0186809 A1 | 7/2010 | Samuelson | |
| 2010/0193766 A1 * | 8/2010 | Romain-Latu | H10D 62/118 |
| | | | 977/932 |
| 2011/0133060 A1 | 6/2011 | Yu | |
| 2011/0240099 A1 * | 10/2011 | Ellinger | H10F 77/1645 |
| | | | 136/250 |
| 2011/0240953 A1 * | 10/2011 | Ellinger | H10H 20/818 |
| | | | 257/E29.168 |
| 2012/0032148 A1 * | 2/2012 | Olson | H10F 10/11 |
| | | | 977/762 |
| 2015/0145083 A1 | 5/2015 | Chou | |
| 2016/0163753 A1 | 6/2016 | Yu | |
| 2016/0163904 A1 | 6/2016 | Mailoa | |
| 2016/0225811 A1 * | 8/2016 | Yu | H10F 39/199 |
| 2025/0324844 A1 * | 10/2025 | Gu | H10K 30/88 |

FOREIGN PATENT DOCUMENTS

| CN | 104485421 A | 4/2015 |
| CN | 105814689 A | 7/2016 |
| CN | 107123706 A | 9/2017 |
| CN | 107579138 A | 1/2018 |
| CN | 107919409 A | 4/2018 |
| CN | 108091661 A | 5/2018 |
| CN | 111430480 A | 7/2020 |
| CN | 113161432 A | 7/2021 |
| JP | 2015-82653 A | 4/2015 |
| KR | 10-0842871 B1 | 7/2008 |
| KR | 10-2011-0046128 A | 5/2011 |
| KR | 10-2011-0075865 A | 7/2011 |
| WO | 2014/088405 A1 | 6/2014 |

* cited by examiner

IMAGE SENSOR AND MANUFACTURING METHOD THEREOF

CROSS REFERENCE TO RELATED APPLICATIONS

This application is a continuation-in-part of U.S. application Ser. No. 17/137,300, filed on Dec. 29, 2020. The content of the application is incorporated herein by reference.

BACKGROUND OF THE INVENTION

1. Field of the Invention

The present invention relates to an image sensor and a manufacturing method thereof, in particular to an image sensor comprising a nanowire photodiode made of perovskite material.

2. Description of the Prior Art

As the development of electronic products such as digital cameras and scanners progresses, the demand for image sensors increases accordingly. In general, commonly used image sensors are nowadays divided into two main categories: the charge coupled device (CCD) sensors and the CMOS image sensors (CIS). Primarily, CMOS image sensors have certain advantages of low operating voltage, low power consumption, and property of random access. Furthermore, CMOS image sensors can currently be integrated in semiconductor fabrication processes. Based on those benefits, the application of CMOS image sensors has increased significantly.

The CMOS image sensor separates incident light into a combination of light beams of different wavelengths. For example, the CMOS image sensor can consider incident light as a combination of red, blue, and green light. The light of different wavelengths is received by respective optically sensitive elements such as photodiodes and is subsequently transformed into digital signals of different intensities.

In the conventional CMOS image sensor (CIS), the photodiode is fabricated inside the substrate in the pixel region, occupying a large number of pixel regions. And the photodiode includes a P-N junction, so the P-N junction is also located inside the substrate, which easily causes photoelectrons to diffuse into the substrate, increasing crosstalk and parasitic light sensitivity, and affecting the performance of the CMOS image sensor.

SUMMARY OF THE INVENTION

The present invention provides an image sensor, the image sensor includes a substrate, a first circuit layer on the substrate, at least one nanowire photodiode located on the first circuit layer and electrically connected with the first circuit layer, wherein the nanowire photodiode comprises a lower material layer and an upper material layer, and a P-N junction or a Schottky junction is arranged between the lower material layer and the upper material layer, wherein the lower material layer comprises a perovskite material, and a precursor layer located under the lower material layer, wherein the precursor layer comprises different metal elements as the lower material layer.

The present invention further provides method for forming an image sensor, the method including: providing a substrate, forming a first circuit layer on the substrate, forming at least one nanowire photodiode on the first circuit layer and electrically connected with the first circuit layer, wherein the nanowire photodiode comprises a lower material layer and an upper material layer, and a P-N junction is formed between the lower material layer and the upper material layer, wherein the lower material layer comprises perovskite material, and forming a precursor layer under the lower material layer, wherein the precursor layer comprises different metal elements as the lower material layer.

The present invention provides an image sensor and its manufacturing method, which includes a nanowire photodiode composed of perovskite material and metal oxide layer. The nanowire photodiode is located above the circuit layer, which can reduce the occupied area of devices and reduce crosstalk. In addition, the method provided by the invention uses a low-temperature deposition method to form the nanowire photodiode, which can be integrated with the existing process without damaging the device quality.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the Figures are only for illustration and the Figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figures 1, 2:
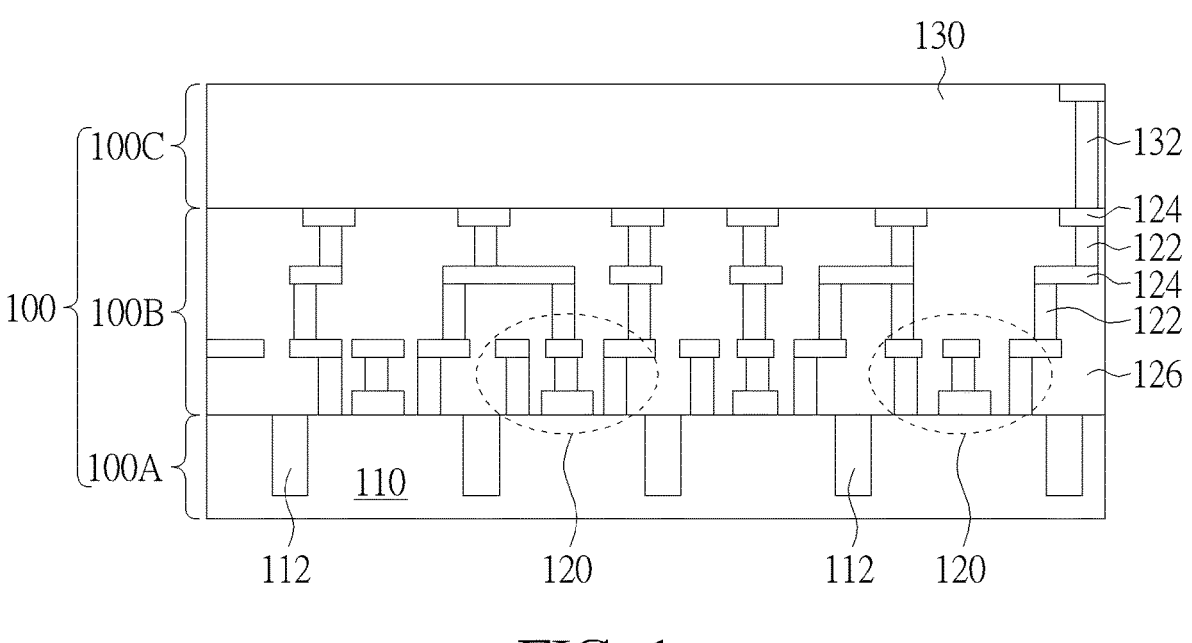
FIG. 1 show schematic cross-sectional structures of an image sensing device according to an embodiment of the present invention.
FIG. 2 is a schematic drawing in a step subsequent to FIG. 1.

Please refer to FIGS. 1, 2, 3, 4, 5, 6 and 7, which are schematic cross-sectional structures of an image sensor fabricated according to an embodiment of the present invention. As shown in FIG. 1, first, a first device 100 is provided, which includes a substrate region 100A, a circuit region 100B on the substrate region 100A, and an image sensor region 100C on the circuit region 100n.

The substrate region 100A includes a substrate 110 and an insulating structure 112 in the substrate 110. The substrate 110 can be various semiconductor substrates, such as silicon substrate, epitaxial silicon substrate, silicon germanium substrate, silicon carbide substrate or silicon-on-insulator, SOI) substrate. The insulating structure 112 is, for example, shallow trench isolation, STI), and the material may include silicon oxide, silicon nitride or other insulating materials. The above-mentioned other materials or structural features of the substrate 110 and the insulating structure 112 belong to the conventional technology in the field, and will not be described in detail here.

The circuit region 100B may contain elements such as transistors, conductive lines and plugs connecting the elements, which are located in the dielectric layer. In this embodiment, the circuit region 100B includes a transistor 120, at least one conductive plug 122 connected to the transistor 120, and at least one conductive line 124 connected to the conductive plug 122, which are located in a dielectric layer 126. In which the transistor 120 includes structures such as a gate (G), a source (S) and a drain (D), and a semiconductor layer. The conductive plugs 122 and the conductive lines 124 can be made of materials with good conductivity, such as tungsten, cobalt, copper, aluminum and other metals. The dielectric layer 126 can be made of silicon oxide, silicon nitride, silicon oxynitride, etc. This embodiment takes silicon oxide as an example, but is not limited to this. Other materials or structural features of the transistor 120, the conductive plug 122, the conductive line 124 and the dielectric layer 126 are well known in the art, and will not be described in detail here.

The image sensor region 100C is used to define the position of pixel region, which includes image sensors (such as light emitting diodes), color filters, microlenses and other structures. The above elements will be formed in subsequent steps. As shown in FIG. 1, the image sensor region 100C includes a dielectric layer 130 and a contact structure 132, the dielectric layer 130 is made of silicon oxide, silicon nitride, silicon oxynitride, etc. This embodiment takes silicon oxide as an example, but is not limited to this. The contact structure 132 can be made of a material with good conductivity, such as tungsten, cobalt, copper, aluminum and other metals. In this embodiment, the contact structure 132 is used to electrically connect the conductive plugs 122 or conductive lines 124 in the lower circuit region 100B, and then electrically connect to some transistors 120.

Then, as shown in FIG. 2, an etching step is performed in the dielectric layer 130 to form a plurality of nanowire holes 134, each of the nanowire holes 134 corresponds to the conductive plug 122 or the conductive line 124 below. In addition, in the following steps, a photodiode will be formed in the nanowire hole 134, and color filters and microlenses will be formed on the photodiode. Therefore, the position of the nanowire hole 134 in this embodiment also defines the position of the pixel region of the image sensor. In this embodiment, the nanowire holes 134 can be arranged in an array (not shown), so the color filters (possibly including red, green, blue and other color filters) and microlenses included in the pixel region are also arranged in an array. In this embodiment, in order to simplify the drawing, only part of the nanowire holes 134 are drawn.

Figure 3:
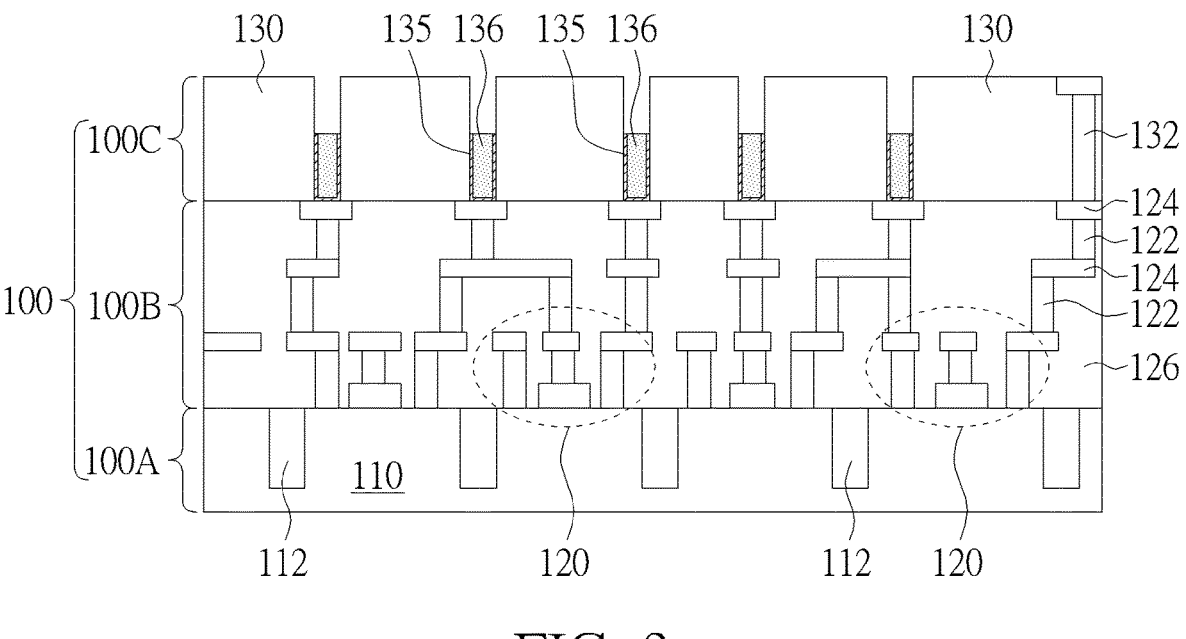
FIG. 3 is a schematic drawing in a step subsequent to FIG. 2.

Referring to FIG. 3, a lower material layer 136 is formed in the nanowire hole 134, the lower material layer 136 can be formed by chemical vapor deposition (CVD), but is not limited to this, and may also be formed by physical vapor deposition (PVD) or atomic layer deposition (ALD). It is worth noting that in this embodiment, the lower material layer 136 is formed after the circuit region 100B has been formed. Therefore, in order to prevent the process temperature when forming the lower material layer 136 from affecting the devices (transistors 120, etc.) in the lower circuit region 100B, the lower material layer 136 will be formed by a low-temperature deposition process. In this embodiment, the temperature of the low-temperature deposition process is lower than 400 degrees Celsius, so as to prevent the temperature from affecting the device quality in the lower circuit region 100B.

In addition, it is worth noting that the lower material layer 136 used in this embodiment comprises a perovskite material, and the general formula of the perovskite material is $ABX_3$, where A contains methylamine ions, formamidine ions and metal cesium ions (Cs+), B contains metal cations (Pb2+, Sn2+, Bi2+), and X contains halogen anions (Cl—, Br). Taking this embodiment as an example, the lower material layer 136 includes $MAPbI_3$, $FASnCl_3$, $FASnBr_3$, $FASnI_3$, $FASnClxBryI_3$-x-y, $MASnCl_3$, $MASnBr_3$, $MASnI_3$, $MASnClxBryI_3$-x-y, $CsSnCl_3$, $CsSnBr_3$, $CsSnI_3$, $CsSnClxBryI_3$-x-y, $FAPbCl_3$, $FAPbBr_3$, $FAPbI_3$, $FAPbClxBryI_3$-x-y, $MAPbCl_3$, $MAPbBr_3$, $MAPbI_3$, $MAPbClxBryI_3$-x-y, $CsPbCl_3$, $CsPbBr_3$, $CsPbI_3$, $CsPbClxBryI_3$-x-y, $FABiCl_3$, $FABiBr_3$, $FABiI_3$, $FABiClxBryI_3$-x-y, $MABiCl_3$, $MABiBr_3$, $MABiI_3$, $MABiClxBryI_3$-x-y, $CsBiCl_3$, $CsBiBr_3$, $CsBiI_3$, and $CsBiClxBryI_3$-x-y, where parameters x and y range from 0 to 3. Perovskite material has strong light absorption, can be deposited at low temperature, has direct band gap, and can change the band gap and other characteristics by adjusting the material composition. Therefore, it is a material suitable for the photodiode of CMOS image sensor. In this embodiment, the perovskite material is deposited by CVD, and the process temperature can be controlled lower than 400 degrees Celsius, thereby reducing the probability of affecting other components below.

In addition, in some embodiments, before the lower material layer 136 in the nanowire hole 134 is formed, a precursor layer 135 may be formed in the nanowire hole 134, the precursor layer 135 is located between the lower material layer 136 and the bottom surface of the nanowire hole 134 (i.e. the exposed conductive line 124). The precursor layer 135 contains the same metal elements as one of the components of the lower material layer 136, which can help the lower material layer 136 and the conductive line 124 to be more firmly bonded. The material of that precursor lay 135 can be adjusted accord to the material of the lower material layer 136, for example, if the lower material lay 136 is methylamino lead iodide, the precursor layer 135 can include lead, but is not limited to this.

In the above embodiment shown in FIG. 3, the precursor layer 135 contains the same metal elements as one of the components of the lower material layer 136. Therefore, after the precursor layer 135 and the lower material layer 136 are formed in the nanowire hole 134, and an etching process is then performed to remove parts of the precursor layer 135 and the lower material layer 136, a top surface of the precursor layer 135 and a top surface of the lower material layer 136 in the nanowire hole 134 are aligned with each other.

Figure 3A:
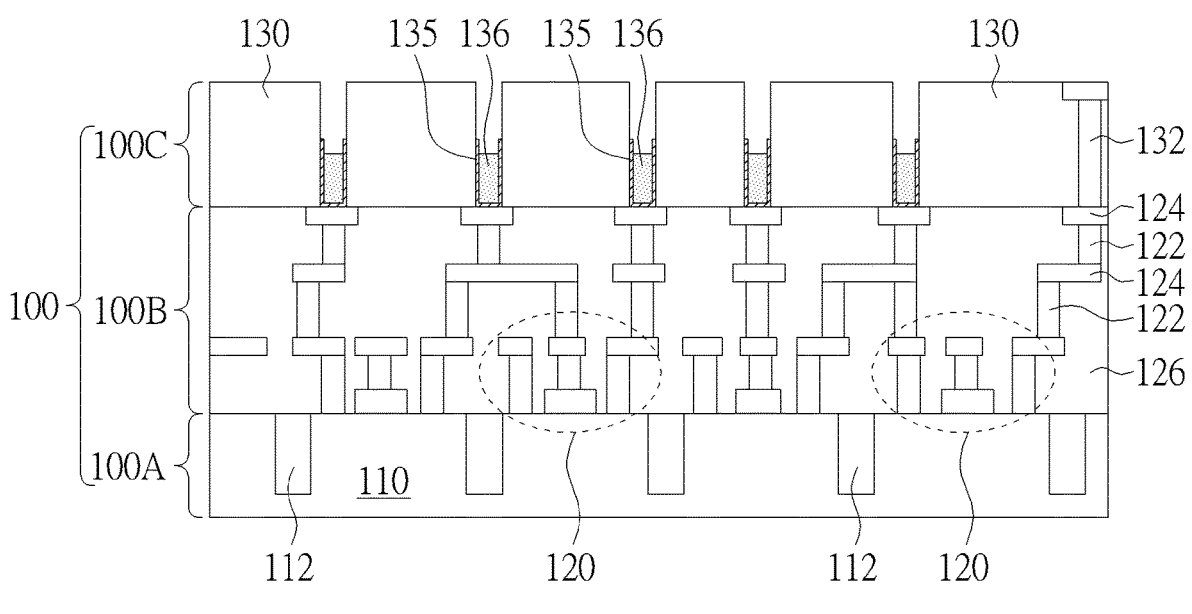
FIG. 3A and FIG. 3B show schematic cross-sectional structures of an image sensing device according to another two embodiments of the present invention.
Figure 3B:
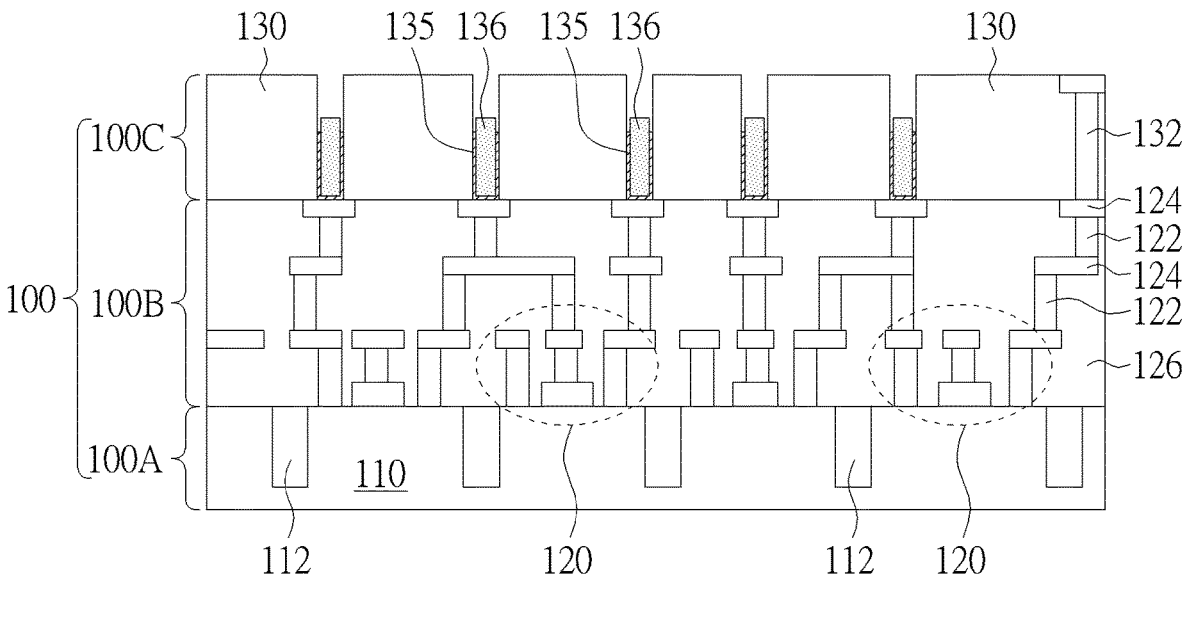

FIG. 3A and FIG. 3B show schematic cross-sectional structures of an image sensing device according to another two embodiments of the present invention. In other embodiments of the present invention, the precursor layer 135 and the lower material layer 136 may contain different metal elements.

Therefore, after the precursor layer 135 and the lower material layer 136 are formed in the nanowire hole 134, and an etching process is then performed to remove parts of the precursor layer 135 and the lower material layer 136, since the etching ratio of the precursor layer 135 and the etching ratio of the lower material layer 136 are different, so a top surface of the precursor layer 135 and a top surface of the lower material layer 136 may not aligned with each other (the top surface of the precursor layer 135 and the top surface of the lower material layer 136 are disposed on different levels). In other words, in FIG. 3A, the top surface of the precursor layer 135 is higher than the top surface of the lower material layer 136; or in FIG. 3B, the top surface of the precursor layer 135 is lower than the top surface of the lower material layer 136. The structures of the two embodiments are both within the scope of the present invention.

In the following paragraphs, for the sake of clear description, the description is continued with the structure of FIG. 3 (namely, the top surface of the precursor layer 135 and the top surface of the lower material layer 136 in the nanowire hole 134 are aligned with each other). However, it is worth noting that the descriptions in the following paragraphs can also combine the structures of FIG. 3A or FIG. 3B (namely, the top surface of the precursor layer 135 may higher or lower than the top surface of the lower material layer 136), and this variation also belongs to the implementation scope of the present invention.

Figures 4, 5:
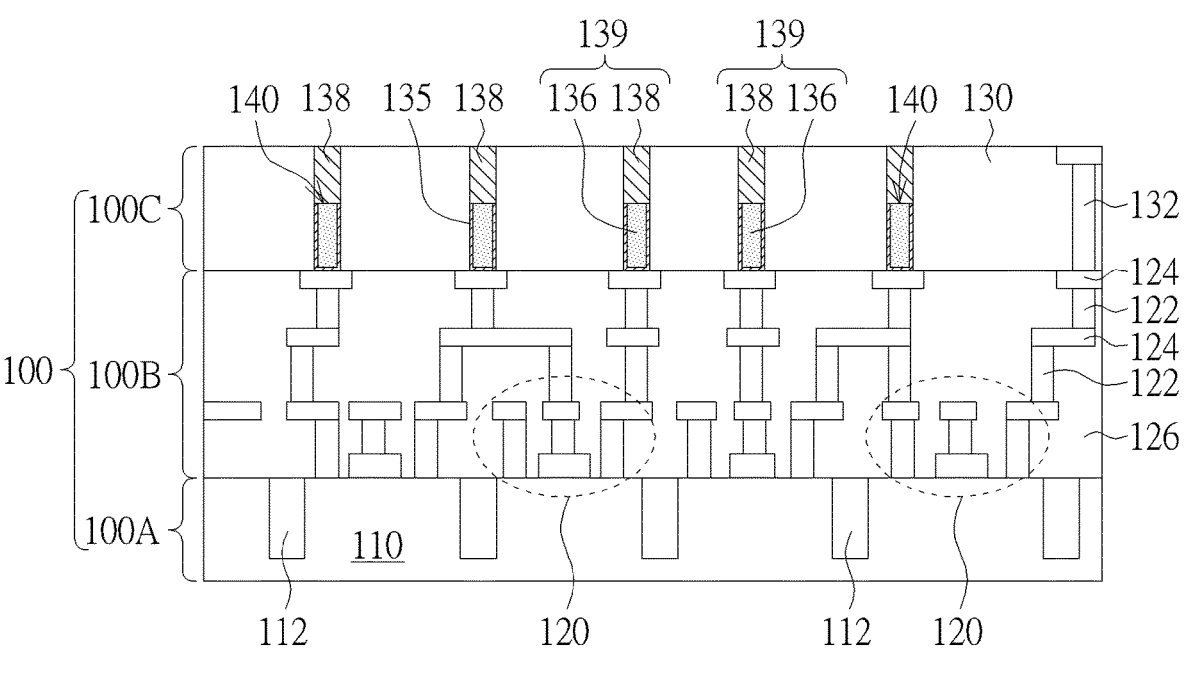
FIG. 4 is a schematic drawing in a step subsequent to FIG. 3.
FIG. 5 is a schematic drawing in a step subsequent to FIG. 4.

As shown in FIG. 4, FIG. 4 is a schematic drawing in a step subsequent to FIG. 3, after the lower material layer 136 is formed in the nanowire hole 134, if the lower material layer 136 has filled the nanowire hole 134, parts of the lower material layer 136 in the nanowire hole 134 can be removed by an etching back step or a planarization step, and then an upper material layer 138 is then formed in the nanowire hole 134. It can be understood that if the lower material layer 136 is formed without filling the nanowire hole 134, the above steps such as etching back can be omitted, and the upper material layer 138 can be directly formed in the nanowire hole 134.

In this embodiment, the upper material layer 138 is, for example, an excessive metal oxide with strong p-type doping ability, a small molecule with strong electron receiving ability, a p-type material, such as $MnO_3$ (molybdenum trioxide), $V_2O_5$, $WO_3$, Si, Ge, GaAs, GaN, $WSe_2$, NiO, $Cu_2O$, CuO, TCNQ (Tetracyanoquinodimethane), and F4-TCNQ, but not limited to this. After both the lower material layer 136 and the upper material layer 138 are completed, the lower material layer 136 (perovskite material) in the nanowire hole 134 contains N-type conductivity type, while the upper material layer 138 contains P-type conductivity type. Therefore, they together constitute a nanowire photodiode 139 (composed of a lower material layer 136 and an upper material layer 138), and the nanowire photodiode 139 includes a P-N junction 140 located at the interface between the lower material layer 136 and the upper material layer 138. In this embodiment, the nanowire photodiode 139 and the P-N junction 140 are located in the nanowire hole 134 above the circuit region 100B, which has the following advantages: firstly, the nanowire photodiode 139 does not occupy too much area of the substrate 110, which is beneficial to the miniaturization of the whole image sensor, and because the P-N junction 140 is not located inside the substrate 110, therefore, when the nanowire photodiode 139 absorbs light to generate carriers, the carriers are not easy to diffuse into the substrate 110, and the floating diffusion (FD) in the substrate 110 is prevented from being affected by the carriers.

Then, as shown in FIG. 5, a transparent electrode 142 is formed on the nanowire photodiode 139. The material of the transparent electrode 142 is indium tin oxide (ITO), fluorine-doped tin oxide (FTO), silver nanowire mesh, graphene, etc. The transparent electrode 142 has conductivity, and it can be electrically connected to the lower nanowire photodiode 139, and has good light transmittance, so that light can pass through the transparent electrode 142 and reach the nanowire photodiode 139.

In other embodiments of the present invention, different junction can be formed on the lower material layer by adjusting the lower material layer 136 and the upper material layer 138. For example, in the above embodiment, it has been mentioned that if the lower material layer 136 and the upper material layer 138 contain specific materials (as described in the previous paragraph, the details are not repeated here), the P-N junction 140 can be formed between the lower material layer 136 and the upper material layer 138. However, in other embodiments of the present invention, if the upper material layer 138 is omitted after the lower material layer 136 is formed, and the transparent electrode 142 is then directly formed on top of the lower material layer 136, a Schottky junction can be formed at the interface between the lower material layer 136 and the transparent electrode 142, and this embodiment also falls within the scope of the present invention.

In addition, the P-N junction 140 of the present invention includes two types: homojunction and heterojunction, and the difference depends on the material of the upper material layer 138. For example, if the upper material layer 138 selects excessive metal oxides (e.g., $V_2O_5$, $WO_3$) with strong P-type doping ability and small molecules (e.g., TCNQ, F4-TCNQ) with strong electron receiving ability, the formed P-N junction is a homogeneous junction. On the other hand, if the material of the upper material layer 138 is directly selected from p-type materials, such as Si, Ge, GaAs, GaN, $WSe_2$, NiO, $Cu_2O$, CuO etc., the formed P-N junction is a heterojunction.

Figure 6:
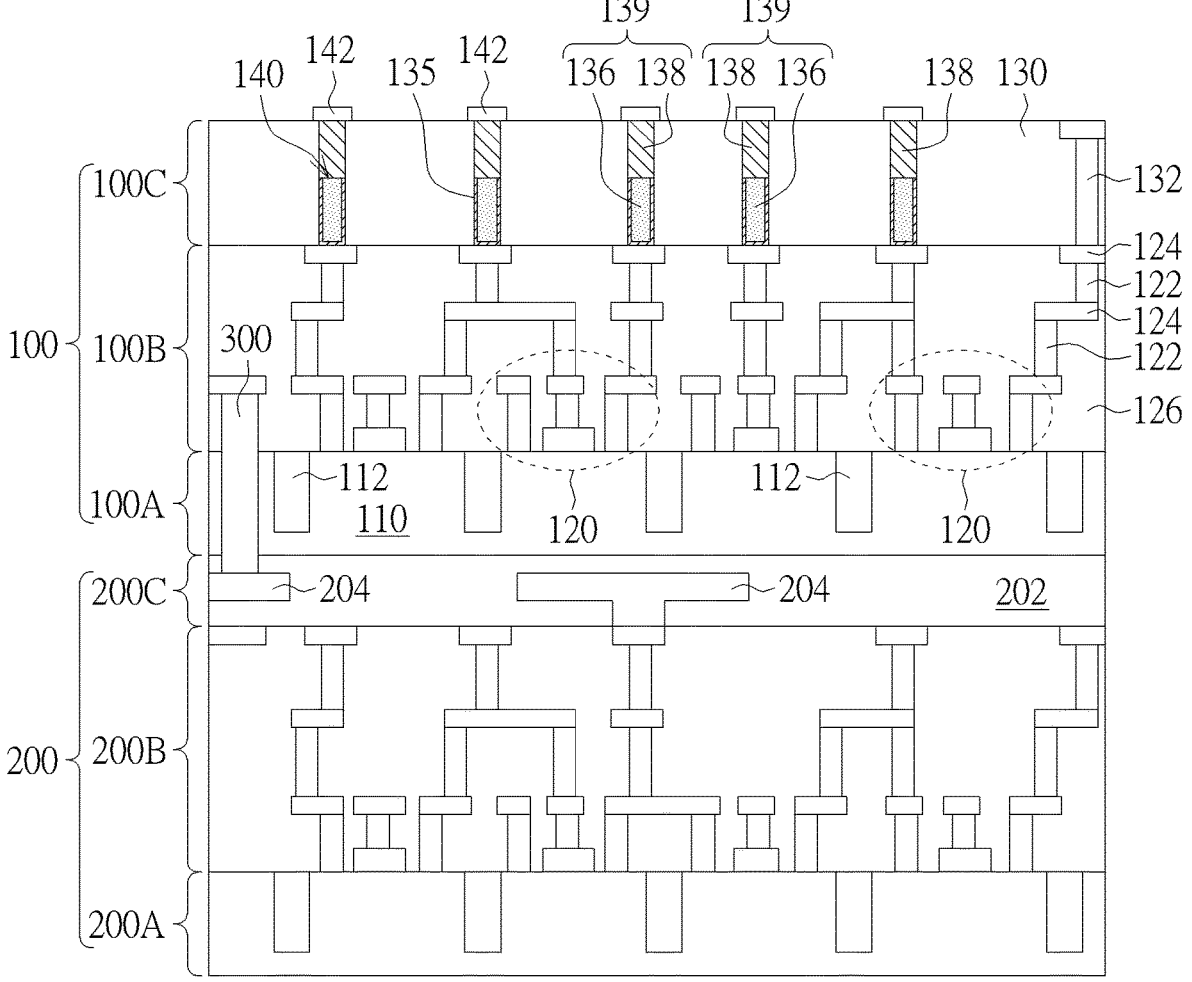
FIG. 6 is a schematic drawing in a step subsequent to FIG. 5.

As shown in FIG. 6, the currently formed first device 100 (including the substrate region 100A, the circuit region 100B and the image sensor region 100C) is combined with another second device 200. The second device 200 may mainly include a substrate region 200A (including a substrate 210), a circuit region 200B and a bonding region 200C. The substrate region 200A and the circuit region 200B may be similar to the substrate region 100A and the circuit region 100B mentioned above, so they will not be described in detail here.

The second device 200 and the first device 100 may be formed on different substrates respectively. Next, the first device 100 and the second device 200 are combined with each other in the step of FIG. 6. Furthermore, the bonding region 200C is formed above the circuit region 200B of the second device 200, and the bonding region 200C may include a bonding layer 202 and wires 204 inside the bonding layer 202, the bonding layer 202 is, for example, an adhesive layer or other structural layer that can help to bond the first device 100 and the second device 200, and the wires 204 can be located in the bonding layer 202 and electrically connected with the circuit region 200B below.

In FIG. 6, the first device 100 and the second device 200 are combined with each other, and can be electrically connected by forming a contact structure 300, such as a through silicon via (TSV). In this embodiment, the second device 200 can be used as a logic circuit region of the image sensor. That is to say, in this embodiment, the first device 100 including the pixel region and the logic circuit region (the second device 200) of the image sensor can be fabricated separately and then combined with each other.

Figure 7:
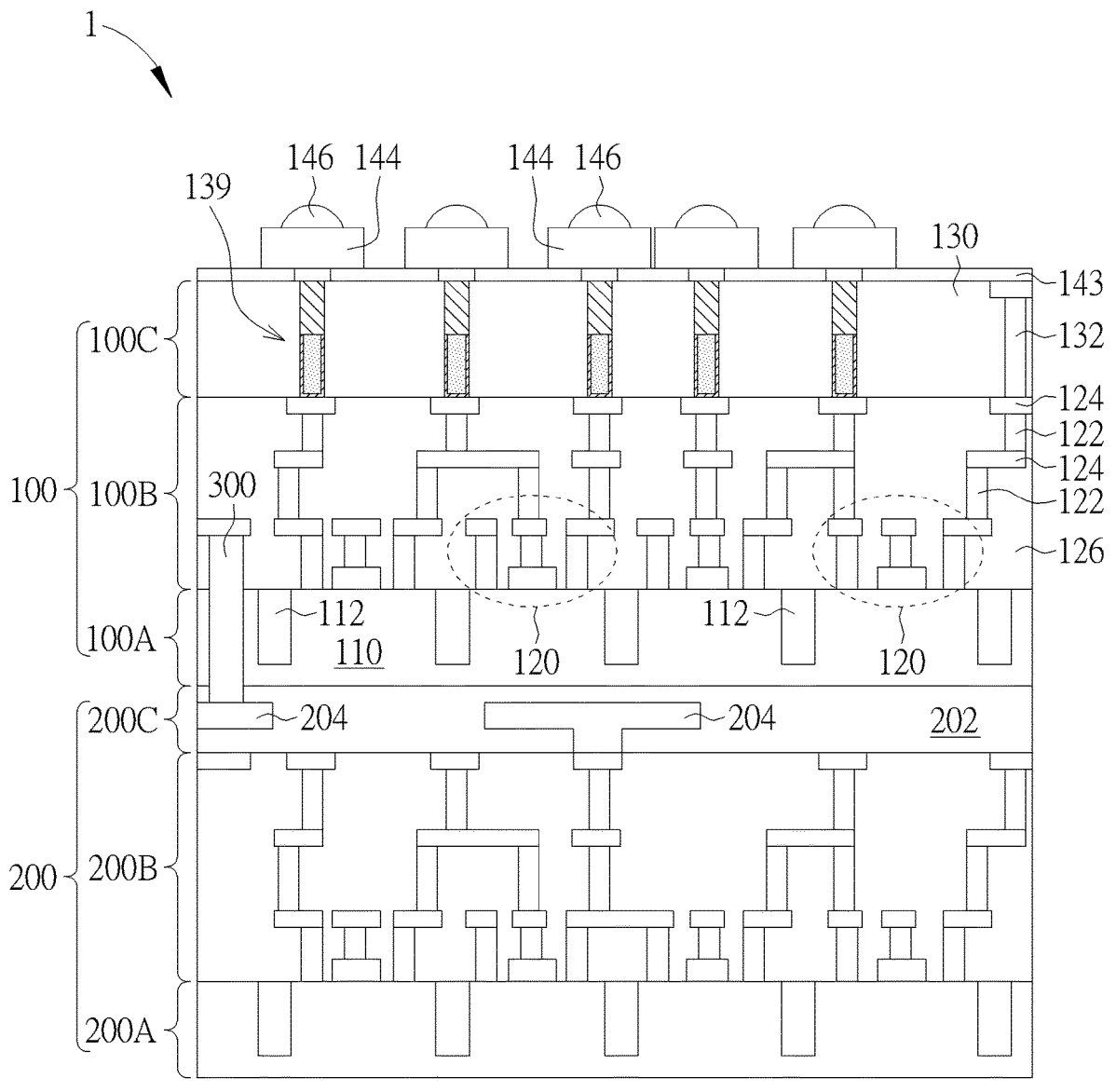
FIG. 7 is a schematic drawing in a step subsequent to FIG. 6.

As shown in FIG. 7, after a planarization layer 143 is formed to cover the transparent electrodes 142, a plurality of color filters 144 are formed on the planarization layer 143 corresponding to each transparent electrode 142. The planarization layer 143 is, for example, a photoresist material, but is not limited thereto. The steps of forming these color filters can be summarized as follows: firstly, a first spin coating process is performed to form a first color filter layer (not shown) with a first color (e.g., blue) on the surface of the transparent electrode 142, and then a mask (not shown) with a first color filter pattern is used to perform a first pattern transfer step on the first color filter layer to form at least one first color filter on the transparent electrode 142. Then, a second color filter with a second color (e.g., green), a third color filter with a third color (e.g., red), or more color filters with other colors are manufactured by the same method, and the color filter array is completed. Thereafter, a planarization layer (not shown) is formed on the color filter 144 by a deposition step and/or an etching step, and a plurality of microlenses 146 and a selective protective layer (not shown) are formed on the surface of the planarization layer, thus completing the image sensor 1 of the present invention.

With reference to FIGS. 1, 2, 3, 3A, 3B, 4, 5, 6 and 7, the present invention provides an image sensor 1 including a substrate 110, a circuit layer 100B on the substrate 110, at least one nanowire photodiode 139 on the first circuit layer 100B and electrically connected with the circuit layer 100B, the nanowire photodiode 139 includes a lower material layer 136 and an upper material layer 138. There is a P-N junction 140 or a Schottky junction between the lower material layer 136 and the upper material layer 138, the lower material layer 136 is made of perovskite material, and a precursor layer 135 located under the lower material layer 136, the precursor layer 135 comprises different metal elements as the lower material layer 136.

In some embodiments of the present invention, the general formula of the perovskite material is $ABX_3$, where A contains methylamine ions, formamidine ions and metal cesium ions (Cs+), B contains metal cations (Pb2+, Sn2+, Bi2+), and X contains halogen anions (Cl—, Br—,I—).

In some embodiments of the present invention, the perovskite material comprises $MAPbI_3$, $FASnCl_3$, $FASnBr_3$, $FASnI_3$, $FASnClxBryI_3$-x-y, $MASnCl_3$, $MASnBr_3$, $MASnI_3$, $MASnClxBryI_3$-x-y, $CsSnCl_3$, $CsSnBr_3$, $CsSnI_3$, $CsSnClxBryI_3$-x-y, $FAPbCl_3$, $FAPbBr_3$, $FAPbI_3$, $FAPbClxBryI_3$-x-y, $MAPbCl_3$, $MAPbBr_3$, $MAPbI_3$, $MAPbClxBryI_3$-x-y, $CsPbCl_3$, $CsPbBr_3$, $CsPbI_3$, $CsPbClxBryI_3$-x-y, $FABiCl_3$, $FABiBr_3$, $FABiI_3$, $FABiClxBryI_3$-x-y, $MABiCl_3$, $MABiBr_3$, $MABiI_3$, $MABiClxBryI_3$-x-y, $CsBiCl_3$, $CsBiBr_3$, $CsBiI_3$, and $CsBiClxBryI_3$-x-y, parameters x and y range from 0 to 3.

In some embodiments of the present invention, the perovskite material contains N-type conductivity type, and the upper material layer 138 has P-type conductivity type.

In some embodiments of the present invention, the upper material layer 138 comprises a metal oxide layer.

In some embodiments of the present invention, the upper material layer 138 comprises $MnO_3$ (molybdenum trioxide), $V_2O_5$, $WO_3$, Si, Ge, GaAs, GaN, $WSe_2$, NiO, $Cu_2O$, CuO, TCNQ (Tetracyanoquinodimethane), and F4-TCNQ.

Some embodiments of the present invention include at least one optical device (including a color filter 144 and a microlens 146) on the nanowire photodiode 139.

Some embodiments of the present invention further include a second device 200, which at least includes a second substrate 210 and a second circuit layer 200B, and further includes a contact structure 300 which penetrates through the substrate 110 and electrically connects the first circuit layer 100B and the second circuit layer 200B.

In some embodiments of the present invention, a top surface of the precursor layer 135 and a top surface of the lower material layer 136 are disposed on different levels (as shown in FIG. 3A or FIG. 3B).

The method for forming an image sensor 1 includes providing a substrate 110, forming a first circuit layer 100B on the substrate 110, forming at least one nanowire photodiode 139 on the first circuit layer 100B and electrically connected with the first circuit layer 100B, the nanowire photodiode comprises a lower material layer 136 and an upper material layer 138, and forming a precursor layer 135 under the lower material layer 136, wherein the precursor layer 135 comprises different metal elements as the lower material layer 136.

In some embodiments of the present invention, the general formula of the perovskite material is $ABX_3$, where A contains methylamine ions, formamidine ions and metal cesium ions (Cs+), B contains metal cations (Pb2+, Sn2+, Bi2+), and X contains halogen anions (Cl—, Br—,I—).

In some embodiments of the present invention, the perovskite material comprises $MAPbI_3$, $FASnCl_3$, $FASnBr_3$, $FASnI_3$, $FASnClxBryI_3$-x-y, $MASnCl_3$, $MASnBr_3$, $MASnI_3$, $MASnClxBryI_3$-x-y, $CsSnCl_3$, $CsSnBr_3$, $CsSnI_3$, $CsSnClxBryI_3$-x-y, $FAPbCl_3$, $FAPbBr_3$, $FAPbI_3$, $FAPbClxBryI_3$-x-y, $MAPbCl_3$, $MAPbBr_3$, $MAPbI_3$, $MAPbClxBryI_3$-x-y, $CsPbCl_3$, $CsPbBr_3$, $CsPbI_3$, $CsPbClxBryI_3$-x-y, $FABiCl_3$, $FABiBr_3$, $FABiI_3$, $FABiClxBryI_3$-x-y, $MABiCl_3$, $MABiBr_3$, $MABiI_3$, $MABiClxBryI_3$-x-y, $CsBiCl_3$, $CsBiBr_3$, $CsBiI_3$, and $CsBiClxBryI_3$-x-y, where parameters x and y range from 0 to 3.

In some embodiments of the present invention, the perovskite material comprises an N-type conductivity type.

In some embodiments of the present invention, wherein the upper material layer 138 comprises a metal oxide layer, the upper material layer 138 has a P-type conductivity type.

In some embodiments of the present invention, the upper material layer 138 comprises $MnO_3$ (molybdenum trioxide), $V_2O_5$, $WO_3$, Si, Ge, GaAs, GaN, $WSe_2$, NiO, $Cu_2O$, CuO, TCNQ (Tetracyanoquinodimethane), and F4-TCNQ.

In some embodiments of the present invention, further comprising forming at least one optical device (including a color filter 144 and a microlens 146) on the nanowire photodiode 139.

In some embodiments of the present invention, a second device 200 is formed, which at least includes a second substrate 210 and a second circuit layer 200B, and a contact structure 300 is formed through the substrate 110 and electrically connected to the first circuit layer 100B and the second circuit layer 200B.

In some embodiments of the present invention, the lower material layer is formed by chemical vapor deposition (CVD) or electrochemical method, and the process temperature is lower than 400 degrees Celsius.

In some embodiments of the present invention, the method of forming the nanowire photodiode 139 includes forming a dielectric layer 130 on the circuit layer 100B and etching a plurality of arrays of nanowire holes 134 on the dielectric layer 130.

In some embodiments of the present invention, the method of forming at least the nanowire photodiode 139 further comprises forming a lower material layer 136 in the nanowire holes 134, and filling part of the nanowire holes 134 with the lower material layer 136 by a chemical mechanical polishing or an etching back method.

In some embodiments of the present invention, the method for forming at least the nanowire photodiode further comprises forming an upper material layer 138 on the lower material layer 136 and filling the nanowire hole 134, wherein a P-N junction 140 is formed between the lower material layer 136 and the upper material layer 138.

In summary, the present invention provides an image sensor and its manufacturing method, which includes a nanowire photodiode composed of perovskite material and metal oxide layer. The nanowire photodiode is located above the circuit layer, which can reduce the occupied area of devices and reduce crosstalk. In addition, the method provided by the invention uses a low-temperature deposition method to form the nanowire photodiode, which can be integrated with the existing process without damaging the device quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
   a substrate;
   a first circuit layer on the substrate;
   at least one nanowire photodiode located on the first circuit layer and electrically connected with the first circuit layer, wherein the nanowire photodiode comprises a lower material layer and an upper material layer, and a P-N junction or a Schottky junction is arranged between the lower material layer and the upper material layer, wherein the lower material layer comprises a perovskite material; and
   a precursor layer located under the lower material layer, wherein the precursor layer comprises different metal elements as the lower material layer.

2. The image sensor according to claim 1, wherein the general formula of the perovskite material is $ABX_3$, where A contains methylamine ions, formamidine ions and metal cesium ions (Cs+), B contains metal cations (Pb2+, Sn2+, Bi2+), and X contains halogen anions (Cl—, Br—,I—).

3. The image sensor according to claim 1, wherein the perovskite material comprises $MAPbI_3$, $FASnCl_3$, $FASnBr_3$, $FASnI_3$, $FASnClxBryI_3$-x-y, $MASnCl_3$, $MASnBr_3$, $MASnI_3$, $MASnClxBryI_3$-x-y, $CsSnCl_3$, $CsSnBr_3$, $CsSnI_3$, CsSn-$ClxBryI_3$-x-y, $FAPbCl_3$, $FAPbBr_3$, $FAPbI_3$, $FAPbClxBryI_3$-x-y, $MAPbCl_3$, $MAPbBr_3$, $MAPbI_3$, $MAPbClxBryI_3$-x-y, $CsPbCl_3$, $CsPbBr_3$, $CsPbI_3$, $CsPbClxBryI_3$-x-y, $FABiCl_3$, $FABiBr_3$, $FABiI_3$, $FABiClxBryI_3$-x-y, $MABiCl_3$, $MABiBr_3$, $MABiI_3$, $MABiClxBryI_3$-x-y, $CsBiCl_3$, $CsBiBr_3$, $CsBiI_3$, and $CsBiClxBryI_3$-x-y, where parameters x and y range from 0 to 3.

4. The image sensor according to claim 1, wherein the perovskite material contains N-type conductivity type, and the upper material layer has P-type conductivity type.

5. The image sensor according to claim 1, wherein the upper material layer comprises a metal oxide layer.

6. The image sensor according to claim 5, wherein the upper material layer comprises $MnO_3$ (molybdenum trioxide), $V_2O_5$, $WO_3$, Si, Ge, GaAs, GaN, $WSe_2$, NiO, $Cu_2O$, CuO, TCNQ (Tetracyanoquinodimethane), and F4-TCNQ.

7. The image sensor according to claim 1, further comprising at least one optical device located on the nanowire photodiode.

8. The image sensor according to claim 1, further comprises a second device, the second device at least comprises a second substrate and a second circuit layer, and a contact structure passing through the substrate and electrically connecting the first circuit layer and the second circuit layer.

9. The image sensor according to claim 1, wherein a top surface of the precursor layer and a top surface of the lower material layer are disposed on different levels.

10. A method for forming an image sensor, comprising:
   providing a substrate;
   forming a first circuit layer on the substrate;
   forming at least one nanowire photodiode on the first circuit layer and electrically connected with the first circuit layer, wherein the nanowire photodiode comprises a lower material layer and an upper material layer, and a P-N junction is formed between the lower material layer and the upper material layer, wherein the lower material layer comprises perovskite material; and
   forming a precursor layer under the lower material layer, wherein the precursor layer comprises different metal elements as the lower material layer.

11. The method according to claim 10, wherein the general formula of the perovskite material is $ABX_3$, where A contains methylamine ions, formamidine ions and metal cesium ions (Cs+), B contains metal cations (Pb2+, Sn2+, Bi2+), and X contains halogen anions (Cl—, Br—,I—).

12. The method according to claim 11 wherein the perovskite material comprises $MAPbI_3$, $FASnCl_3$, $FASnBr_3$, $FASnI_3$, $FASnClxBryI_3$-x-y, $MASnCl_3$, $MASnBr_3$, $MASnI_3$, $MASnClxBryI_3$-x-y, $CsSnCl_3$, $CsSnBr_3$, $CsSnI_3$, CsSn-$ClxBryI_3$-x-y, $FAPbCl_3$, $FAPbBr_3$, $FAPbI_3$, $FAPbClxBryI_3$-x-y, $MAPbCl_3$, $MAPbBr_3$, $MAPbI_3$, $MAPbClxBryI_3$-x-y, $CsPbCl_3$, $CsPbBr_3$, $CsPbI_3$, $CsPbClxBryI_3$-x-y, $FABiCl_3$, $FABiBr_3$, $FABiI_3$, $FABiClxBryI_3$-x-y, $MABiCl_3$, $MABiBr_3$, $MABiI_3$, $MABiClxBryI_3$-x-y, $CsBiCl_3$, $CsBiBr_3$, $CsBiI_3$, and $CsBiClxBryI_3$-x-y, where parameters x and y range from 0 to 3.

13. The method according to claim 10, wherein the perovskite material contains n-type conductivity type.

14. The method according to claim 10, wherein the upper material layer comprises a metal oxide layer, and the upper material layer has a p-type conductivity type.

15. The method according to claim 14, wherein the upper material layer comprises $MnO_3$ (molybdenum trioxide), $V_2O_5$, $WO_3$, Si, Ge, GaAs, GaN, $WSe_2$, NiO, $Cu_2O$, CuO, TCNQ (Tetracyanoquinodimethane), and F4-TCNQ.

16. The method according to claim 10, further comprising forming at least one optical device on the nanowire photodiode.

17. The method according to claim 10, further comprising forming a second device, the second device at least comprises a second substrate and a second circuit layer, and a contact structure passing through the substrate and electrically connecting the first circuit layer and the second circuit layer.

18. The method according to claim 10, wherein the lower material layer is formed by chemical vapor deposition (CVD) or electrochemical method, and the processing temperature is lower than 400 degrees Celsius.

19. The method according to claim 10, wherein the method for forming at least the nanowire photodiode comprises:

forming a dielectric layer on the first circuit layer, and a plurality of arrays of nanowire holes are etched on the dielectric layer.

20. The method according to claim 19, wherein the method for forming at least the nanowire photodiode further comprises:

forming a lower material layer in the nanowire holes, and filling part of the nanowire holes with the lower material layer by a chemical mechanical polishing or an etching back method.

21. The method according to claim 20, wherein the method for forming at least the nanowire photodiode further comprises:

forming an upper material layer on the lower material layer and fills the nanowire holes, wherein a P-N junction or a Schottky junction is formed between the lower material layer and the upper material layer.

22. The method according to claim 10, wherein a top surface of the precursor layer and a top surface of the lower material layer are disposed on different levels.

* * * * *